(12) United States Patent
Terasaki et al.

(10) Patent No.: US 9,723,707 B2
(45) Date of Patent: Aug. 1, 2017

(54) POWER MODULE SUBSTRATE, POWER MODULE SUBSTRATE WITH HEATSINK, POWER MODULE, AND METHOD FOR PRODUCING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/388,051

(22) PCT Filed: Mar. 29, 2013

(86) PCT No.: PCT/JP2013/059500
§ 371 (c)(1),
(2) Date: Sep. 25, 2014

(87) PCT Pub. No.: WO2013/147144
PCT Pub. Date: Oct. 3, 2013

(65) Prior Publication Data
US 2015/0041188 A1 Feb. 12, 2015

(30) Foreign Application Priority Data

Mar. 30, 2012 (JP) ................... 2012-083249
Sep. 14, 2012 (JP) ................... 2012-203362

(51) Int. Cl.
*H05K 1/02* (2006.01)
*H05K 1/09* (2006.01)
(Continued)

(52) U.S. Cl.
CPC ........... *H05K 1/0201* (2013.01); *B23K 20/02* (2013.01); *B23K 20/023* (2013.01);
(Continued)

(58) Field of Classification Search
CPC ............ C04B 37/026; C04B 2237/708; C04B 2237/706; C04B 2237/704;
(Continued)

(56) References Cited

U.S. PATENT DOCUMENTS 3,952,938 A * 4/1976 Ulam ...................... A47J 36/02
228/190
4,427,716 A * 1/1984 Siwek .................... C23C 14/16
148/535
(Continued)

FOREIGN PATENT DOCUMENTS

JP 8-255973 A 10/1996
JP 11-195854 A 7/1999
(Continued)

OTHER PUBLICATIONS

International Search Report mailed May 7, 2013, issued for PCT/JP2013/059500 and English translation thereof.
(Continued)

*Primary Examiner* — Ishwarbhai B Patel
(74) *Attorney, Agent, or Firm* — Locke Lord LLP; James E. Armstrong, IV; Nicholas J. DiCeglie, Jr.

(57) ABSTRACT

A power module substrate includes a circuit layer, an aluminum layer arranged on a surface of an insulation layer, and a copper layer laminated on one side of the aluminum layer. The aluminum layer and the copper layer are bonded together by solid phase diffusion bonding.

12 Claims, 3 Drawing Sheets

(51) Int. Cl.
H05K 1/18 (2006.01)
H05K 3/10 (2006.01)
H01L 23/373 (2006.01)
B23K 20/02 (2006.01)
B23K 20/233 (2006.01)
C04B 37/02 (2006.01)
H01L 23/473 (2006.01)
B23K 103/10 (2006.01)
B23K 103/12 (2006.01)
H01L 23/00 (2006.01)

(52) U.S. Cl.
CPC ........ B23K 20/2333 (2013.01); C04B 37/026 (2013.01); H01L 23/3735 (2013.01); H05K 1/092 (2013.01); H05K 1/18 (2013.01); H05K 1/181 (2013.01); H05K 3/103 (2013.01); B23K 2203/10 (2013.01); B23K 2203/12 (2013.01); C04B 2237/124 (2013.01); C04B 2237/343 (2013.01); C04B 2237/366 (2013.01); C04B 2237/368 (2013.01); C04B 2237/402 (2013.01); C04B 2237/704 (2013.01); C04B 2237/706 (2013.01); C04B 2237/708 (2013.01); H01L 23/473 (2013.01); H01L 24/29 (2013.01); H01L 24/32 (2013.01); H01L 2224/29111 (2013.01); H01L 2224/32225 (2013.01); H01L 2224/83192 (2013.01); H01L 2924/0132 (2013.01); H01L 2924/0133 (2013.01); H01L 2924/01322 (2013.01); H01L 2924/13055 (2013.01); Y10T 29/49155 (2015.01)

(58) Field of Classification Search
CPC .... C04B 2237/402; H05K 3/103; H05K 1/18; H05K 1/092; H05K 1/0201; B23K 20/023; B23K 20/2333; B23K 2203/10; B23K 2203/12; H01L 23/3735; H01L 2224/32225; H01L 2924/01322; H01L 2924/13055; H01L 2224/29111; H01L 24/32; H01L 23/473; H01L 2924/0132; H01L 2924/0133; H01L 24/29; H01L 2924/00; H01L 2924/01047; H01L 2924/0105; H01L 2924/0102; Y10T 29/49155
USPC ................. 174/250–268; 361/760, 792–795
See application file for complete search history.

(56) References Cited

U.S. PATENT DOCUMENTS

| | | | |
|---|---|---|---|
| 6,921,583 B2* | 7/2005 | Koyama | B23K 1/19 228/158 |
| 2012/0202090 A1* | 8/2012 | Yamamoto | B23K 1/19 428/651 |
| 2013/0010429 A1* | 1/2013 | Tonomura | H01L 23/3735 361/720 |
| 2013/0071686 A1* | 3/2013 | Oda | B32B 15/017 428/652 |

FOREIGN PATENT DOCUMENTS

| | | |
|---|---|---|
| JP | 3171234 B2 | 5/2001 |
| JP | 3211856 B2 | 9/2001 |
| JP | 2003-078086 A | 3/2003 |
| JP | 2004-241567 A | 8/2004 |
| JP | 2010-034238 A | 2/2010 |
| JP | 2012-227362 A | 11/2012 |
| WO | WO-2011/155379 A1 | 12/2011 |

OTHER PUBLICATIONS

Notice of Allowance mailed Oct. 1, 2013, issued for the Japanese patent application No. 2012-203362 and English translation thereof.
Office Action mailed Jun. 16, 2015, issued for the Japanese patent application No. 2013-222573 and English translation thereof.
Notification of the Second Office Action issued in corresponding Chinese Patent Application No. CN 201380015967.0, dated Feb. 17, 2017.
G. Yajie et al., "Study on the Phase Growth Behavior of the Diffusion-bonding Interface of Cu Foil and Al Foil", Rare Materials and Engineering, vol. 41, No. 2, p. 281-284, (2012).

* cited by examiner

POWER MODULE SUBSTRATE, POWER MODULE SUBSTRATE WITH HEATSINK, POWER MODULE, AND METHOD FOR PRODUCING POWER MODULE SUBSTRATE

TECHNICAL FIELD

The present invention relates to: a power module substrate formed a circuit layer on a surface of an insulation layer; a power module substrate with a heatsink in which a heatsink is bonded to the power module substrate; a power module in which a semiconductor device is bonded to the power module substrate; and a producing method of the power module substrate.

Priority is claimed on Japanese Patent Application No. 2012-083249, filed Mar. 30, 2012, and Japanese Patent Application No. 2012-203362, filed Sep. 14, 2012, the contents of which are incorporated herein by reference.

BACKGROUND ART

Among various semiconductor devices, power devices for the high-power control that are used to control electric vehicles, electric automobiles or the like, generate a large amount of heat. Thus, a power module substrate in which a metal plate having excellent conductivity and being served as a circuit layer is bonded on a ceramic substrate (insulation layer) composed of, for example, AlN (aluminum nitride) or the like, is conventionally widely used as a substrate for mounting the power devices.

A semiconductor device as a power device is mounted on the circuit layer of the power module substrate mentioned above via a solder material, and a power module is produced. As a power module substrate of this type, a power module substrate having a structure in which a heatsink having an excellent thermal conductivity is also bonded to a lower surface of the ceramic substrate in order to dissipate the heat caused by the semiconductor device and the heat is configured to be dissipated is known.

Al (aluminum), Cu (copper) or the like, is used as a metal making the circuit layer. For example, in Patent Document 1, a power module substrate in which a circuit layer composed of an aluminum plate is bonded to a surface of a ceramic substrate is proposed.

In addition, in Patent Document 2, a power module substrate in which a circuit layer composed of a copper plate is bonded to a surface of a ceramic substrate is proposed.

PRIOR ART DOCUMENTS

Patent Documents

[Patent Document 1] Japanese Patent No. 3171234
[Patent Document 2] Japanese Patent No. 3211856

DISCLOSURE OF THE INVENTION

Problems to be Solved by the Invention

In the power module disclosed in Patent Document 1, the circuit layer is made of an aluminum plate having a relatively small deformation resistance. Thus, when a heat cycle is performed on the power module, the circuit layer can absorb heat stress caused between the ceramic substrate and the circuit layer, but when a power cycle is performed on the power module, there is a case that cracks occur on a solder bonding a semiconductor device and the circuit layer together, and the reliability of the power module reduces. In addition, since thermal conductivity of aluminum is poorer than that of copper, the heat dissipation properties of the circuit layer made of an aluminum plate is poorer than the circuit layer made of a copper plate. Furthermore, since an oxide layer is formed on a surface of aluminum in the aluminum plate, the circuit layer and the semiconductor device are difficult to be bonded together in a good state by using the solder in the above state.

On the other hand, as disclosed in Patent Document 2, when a circuit layer is made of a copper plate, deformation resistance of copper is relatively high. Thus, when the heat cycle is performed on a power module, there is a case that cracks occur on a ceramic substrate by heat stress generated between the ceramic substrate and the copper plate.

In particular, recently, miniaturization and thinning of the power module are promoted, the usage environment thereof has intensified, and the amount of heat generation from electronic components is increased. As the result, the requirements for the power module on the reliability have become strict with respect to the heat cycle and the power cycle. Thus, in a case where the circuit layer is made of aluminum, when the power cycle is performed, reduction of the reliability of the power module becomes a problem. In addition, in a case where the circuit layer is made of copper, when the heat cycle is performed, reduction of the reliability of the power module becomes a problem.

From the above, the circuit layer made of copper has a high reliability with respect to the power cycle; however, the reliability with respect to the heat cycle is reduced. Also, the circuit layer made of aluminum has a high reliability with respect to the heat cycle; however, the reliability with respect to the power cycle is reduced. Thus, the conventional art can only give the priority to the reliability of either one of the power cycle or the heat cycle, and therefore, it was not possible to achieve both reliabilities of the power module with respect to the power cycle and the heat cycle.

The present invention provides a power module substrate suppressing an increase in the thermal resistance when the power cycle is performed thereon, suppressing the occurrence of cracks in the ceramic substrate when the heat cycle is performed, and having a high reliability with respect to the power cycle and the heat cycle; a power module substrate with a heatsink; a power module; and a method for producing the power module substrate.

Means for Solving the Problem

To solve the problem described above, a power module substrate according to an aspect of the present invention is provided with an insulation layer, and a circuit layer formed on a surface of the insulation layer. The circuit layer includes an aluminum layer arranged on the surface of the insulation layer, and a copper layer laminated on one side of the aluminum layer. The aluminum layer and the copper layer are bonded together by solid phase diffusion bonding.

The power module substrate according the present invention, the circuit layer includes the copper layer. In a case where a semiconductor device is mounted on the copper layer, when the heat generated from the semiconductor device is transferred to the power module substrate side, the heat can be dissipated efficiently by spreading the heat in a surface direction in the copper layer included in the circuit layer.

Furthermore, the aluminum layer having relatively small deformation resistance is formed on the surface of the insulation layer, and since the aluminum layer absorbs the heat stress caused by the difference in thermal expansion coefficient between the circuit layer and the insulating layer when a heat cycle is performed, an occurrence of cracks in the insulation layer can be suppressed, and a high reliability with respect to the bonding can be obtained.

In addition, since the copper layer having a relatively high deformation resistance is formed on one side of the aluminum layer, deformation of the circuit layer can be suppressed when a power cycle is performed. Thus, the reliability of the power module substrate with respect to the power cycle can be obtained.

In addition, since the aluminum layer and the copper layer are bonded together by solid phase diffusion bonding, when the heat cycle is performed thereon, an occurrence of peeling between the copper layer and the aluminum layer is suppressed, and the thermal conductivity and the electrical conductivity of the circuit layer can be maintained.

Also, one side of the aluminum layer is the surface side of the aluminum layer to which the insulation layer is not bonded.

In addition, in a bonding interface between the aluminum layer and the copper layer, a diffusion layer including Cu and Al is formed. The diffusion layer has a structure in which a plurality of intermetallic compounds is laminated along the bonding interface, and a bonding interface between the copper layer and the diffusion layer may have a configuration in which an oxide is dispersed in the form of a layer along the bonding interface.

Since the diffusion layer including Cu and Al is formed in the bonding interface between the aluminum layer and the copper layer, Al (aluminum atom) in the aluminum layer and Cu (copper atom) in the copper layer are mutually diffused sufficiently, and the aluminum layer and the copper layer are bonded together firmly.

In addition, in the bonding interface between the copper layer and the diffusion layer, since the oxide is dispersed in the form of a layer along the bonding interface, an oxide film formed on the surface of the aluminum layer is broken and solid phase diffusion bonding progresses sufficiently.

In addition, a thickness of the copper layer may be 0.1 to 6.0 mm.

By setting the thickness of the copper layer in the above range, when the heat generated from the semiconductor device is transmitted to the power module substrate side, the heat can be dissipated more efficiently by spreading the heat in a surface direction in the copper layer included in the circuit layer. Thus, an initial thermal resistance can be reduced when the power cycle is performed thereon. Furthermore, since an occurrence of cracks in a solder can be suppressed even after the power cycle is performed, an increase in thermal resistance can be suppressed.

In addition, the power module substrate with a heatsink according to the present invention includes the power module substrate and a heatsink bonded to the other side of the power module substrate.

In the power module substrate with a heatsink according to the present invention, since the heatsink is bonded to the other side of the power module substrate described above, the heat of the power module substrate can be efficiently dissipated to the heatsink.

In addition, a power module according to the present invention includes the power module substrate, and a semiconductor device bonded to one side of the circuit layer.

In the power module according to the present invention, since the power module substrate described above is used, in a case where the power cycle is performed thereon, when the heat generated from the semiconductor device is transferred to the power module substrate side, the heat can be dissipated efficiently by spreading the heat in a surface direction in the copper layer included in the circuit layer. Accordingly, an increase in temperature of the semiconductor device is suppressed, the semiconductor device can be operated at a predetermined temperature, and the stability of the operation thereof can be improved.

In addition, since the power module according to the present invention has a configuration in which the semiconductor device is bonded to the copper layer via the solder, soldered joint can carry out satisfactorily as compared with the case of a power module including a circuit layer formed of aluminum.

Also, one side of the circuit layer is the surface side of the circuit layer to which the insulation layer is not bonded.

A method for producing a power module substrate according to another aspect of the present invention is a method for producing a power module substrate provided with an insulation layer and a circuit layer formed on a surface of the insulation layer, and the method includes: a circuit layer forming step in which the circuit layer is formed on a surface of the insulation layer; wherein the circuit layer forming step includes: an aluminum layer arranging step in which an aluminum layer is arranged on the surface of the insulation layer; and a copper laminating step in which a copper layer is laminated on one side of the aluminum layer, and wherein in the copper laminating step, the aluminum layer and the copper layer are bonded together by solid phase diffusion bonding.

In the method for producing a power module substrate according to the present invention, the circuit layer forming step includes an aluminum layer arranging step and a copper laminating step, and in the copper laminating step, the aluminum layer and the copper layer are bonded together by solid phase diffusion bonding. Thus, a power module substrate including the circuit layer in which the aluminum layer and the copper layer are bonded together by solid phase diffusion can be obtained.

In addition, in the copper laminating step, the copper layer is laminated on one side of the aluminum layer, and the aluminum layer and the copper layer may be bonded together by solid phase diffusion bonding by maintaining at 400° C. or more to less than 548° C. in a state of pressurizing the aluminum layer and the copper layer at a pressure of 3 to 35 kgf/cm$^2$.

By performing solid phase diffusion bonding under these conditions, the aluminum layer and the copper layer can be reliably bonded together by solid phase diffusion. Also, a gap in the interface between the aluminum layer and the copper layer can be suppressed to be generated.

Effects of the Invention

The present invention can provide a power module substrate suppressing an increase in the thermal resistance when the power cycle is performed thereon, suppressing occurrence of cracks in the ceramic substrate when the heat cycle is performed, and having a high reliability with respect to the power cycle and the heat cycle, a power module substrate with heatsink, a power module, and a method for producing a power module substrate.

EMBODIMENTS OF THE INVENTION

An embodiment of the present invention will be explained below with reference to the accompanying drawings.

Figure 1:
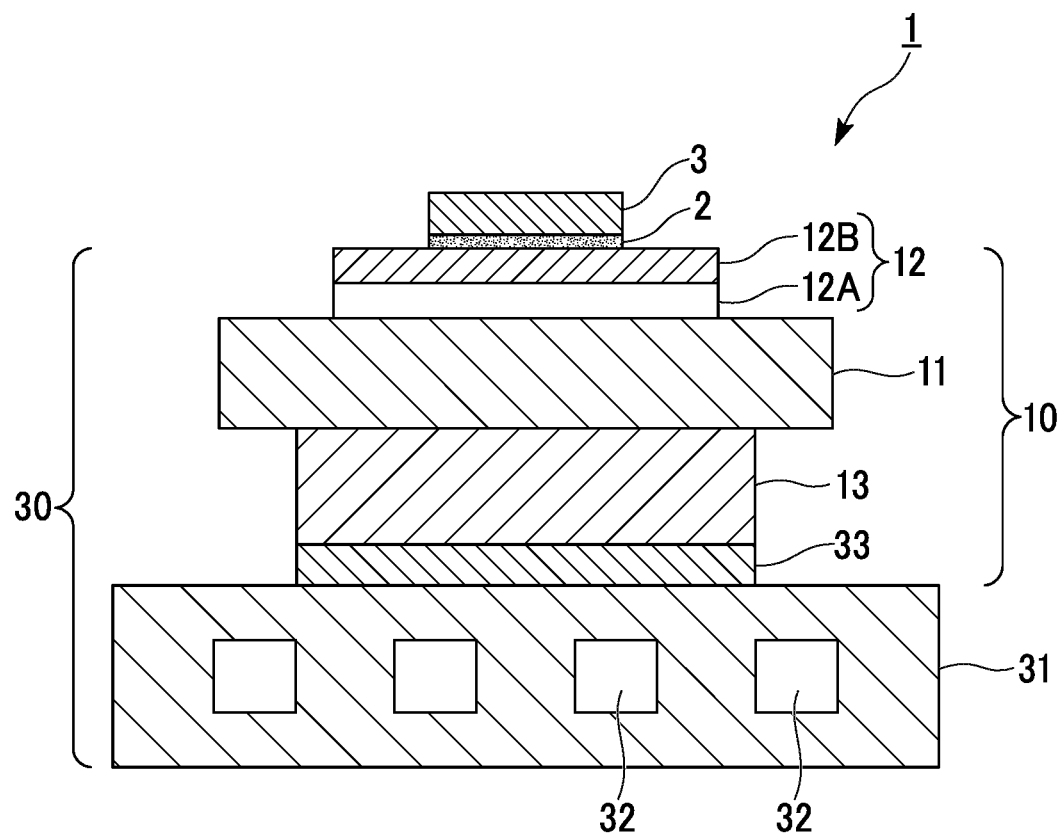
FIG. 1 shows a schematic explanatory diagram of a power module, a power module substrate with a heatsink, and a power module substrate according to an embodiment of the present invention.

FIG. 1 shows a power module 1, a power module substrate with a heatsink 30, and a power module substrate 10 according to an embodiment of the present invention.

The power module 1 includes the power module substrate 20 with a heatsink 30, and a semiconductor device 3 bonded to one side (upper side in FIG. 1) of the power module substrate with a heatsink 30 via a solder layer 2.

The solder layer 2 is, for example, Sn—Ag-based, Sn—Cu-based, Sn—In-based, or Sn—Ag—Cu-based solder materials (so-called, lead-free soldering material), and the solder layer 2 bonds the power module substrate with a heatsink 30 and a semiconductor device 3 together.

The semiconductor device 3 is electronic parts including semiconductor, and various semiconductor devices are selected depending on the functionality required. An IGBT device is used in the present embodiment.

The power module substrate with a heatsink 30 includes the power module substrate 10 and a heatsink 31 bonded to the other side (lower side in FIG. 1) of the power module substrate 10.

As shown in FIG. 1, the power module substrate 10 includes: a ceramic substrate 11 (an insulation layer), the circuit layer 12 formed on a surface of the ceramic substrate 11 (upper surface in FIG. 1), and a metal layer 13 formed on the other surface of the ceramic substrate 11 (lower surface in FIG. 1). That is, the ceramic substrate 11 has a first surface (a surface) and a second surface (the other surface), the circuit layer 12 is formed on the first surface of the ceramic substrate 11, and the metal layer 13 is formed on the second surface of the ceramic substrate 11.

The ceramic substrate 11 is for preventing electric connection between the circuit layer 12 and the metal layer 13, and is composed of AlN (aluminum nitride) having high insulation properties. The thickness of the ceramic substrate 11 is set to 0.2 to 1.5 mm, and the thickness thereof in the present embodiment is set to 0.635 mm.

The metal layer 13 is formed by bonding a metal plate made of aluminum or aluminum alloy on the second surface (lower surface in FIG. 1) of the ceramic substrate 11. In the present embodiment, the metal layer 13 is formed by bonding an aluminum plate 23 made of a rolled sheet of aluminum having a purity of 99.99% or more (so-called 4N aluminum) to the ceramic substrate 11.

As shown in FIG. 1, the circuit layer 12 includes an aluminum layer 12A arranged on the first surface of the ceramic substrate 11, and a copper layer 12B laminated on one side (upper side in FIG. 1) of the aluminum layer 12A.

Figure 5:
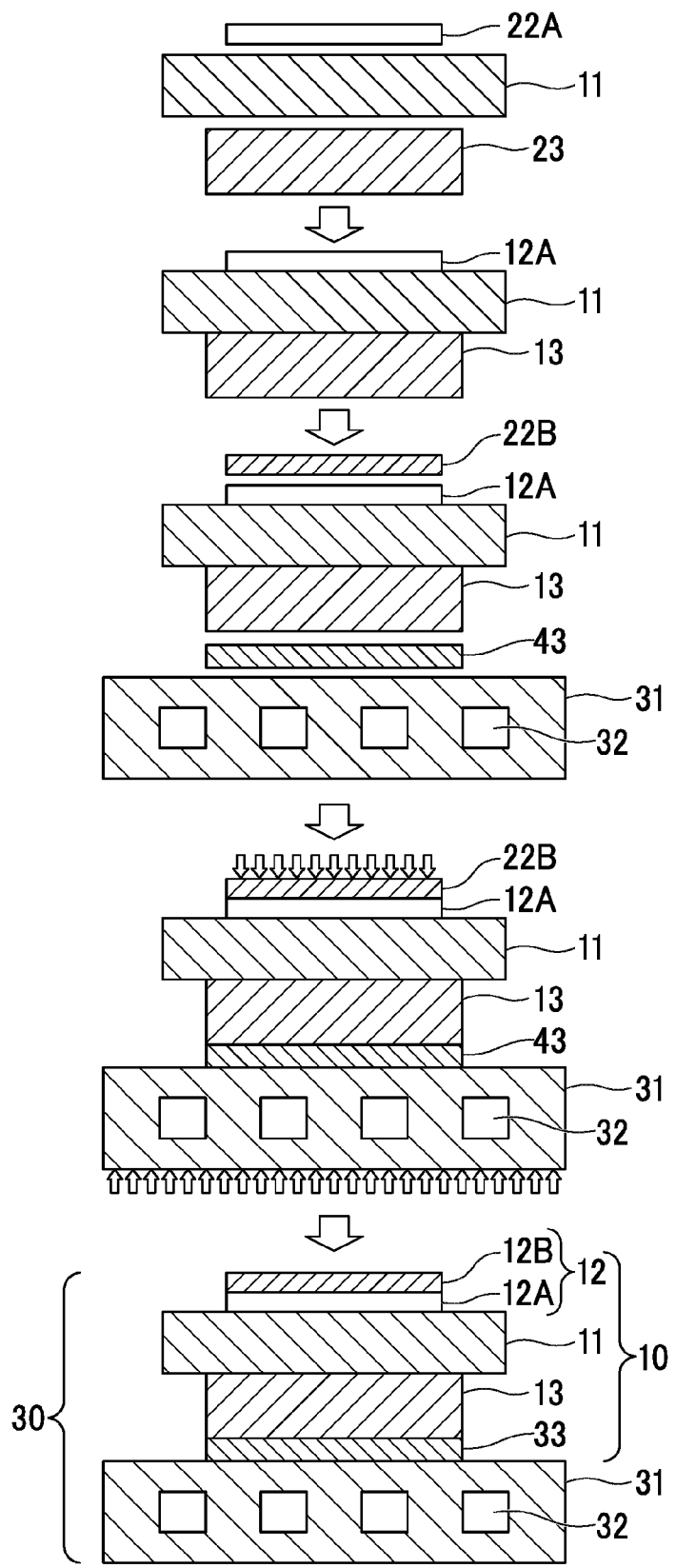
FIG. 5 shows a schematic explanatory diagram of a method for producing a power module substrate with a heatsink according to the embodiment of the present invention.

As shown in FIG. 5, the aluminum layer 12A is formed by bonding an aluminum plate 22A to the first surface of the ceramic substrate 11. In the present embodiment, the aluminum layer 12A is formed by bonding the aluminum plate 22A made of a rolled sheet of aluminum having a purity of 99.99% by mass or more (so-called 4N aluminum) to the ceramic substrate 11.

The copper layer 12B is formed by being bonded to one side (upper side in FIG. 1) of the aluminum layer 12A.

In the present embodiment, as shown in FIG. 5, the copper layer 12B is formed by bonding a copper plate 22B made of a rolled sheet of an oxygen-free copper to the aluminum layer 12A using solid phase diffusion bonding.

Figure 2:
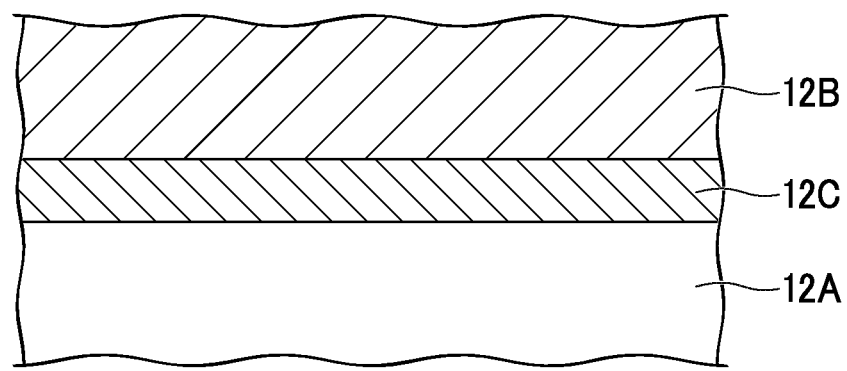
FIG. 2 shows an enlarged view of an interface between an aluminum layer and the copper layer in FIG. 1.

In an interface between these aluminum layer 12A and copper layer 12B, as shown in FIG. 2, a diffusion layer 12C is formed. The thickness of the copper layer 12B is preferred to be set to 0.1 to 6.0 mm.

The diffusion layer 12C is formed by which aluminum atom in the aluminum layer 12A and copper atom in the copper layer 12B are mutually diffused. The diffusion layer 12C has a concentration gradient in which the concentration of aluminum atoms lowers gradually and the concentration of copper atoms increases gradually toward the copper layer 12B from the aluminum layer 12A.

Figure 3:
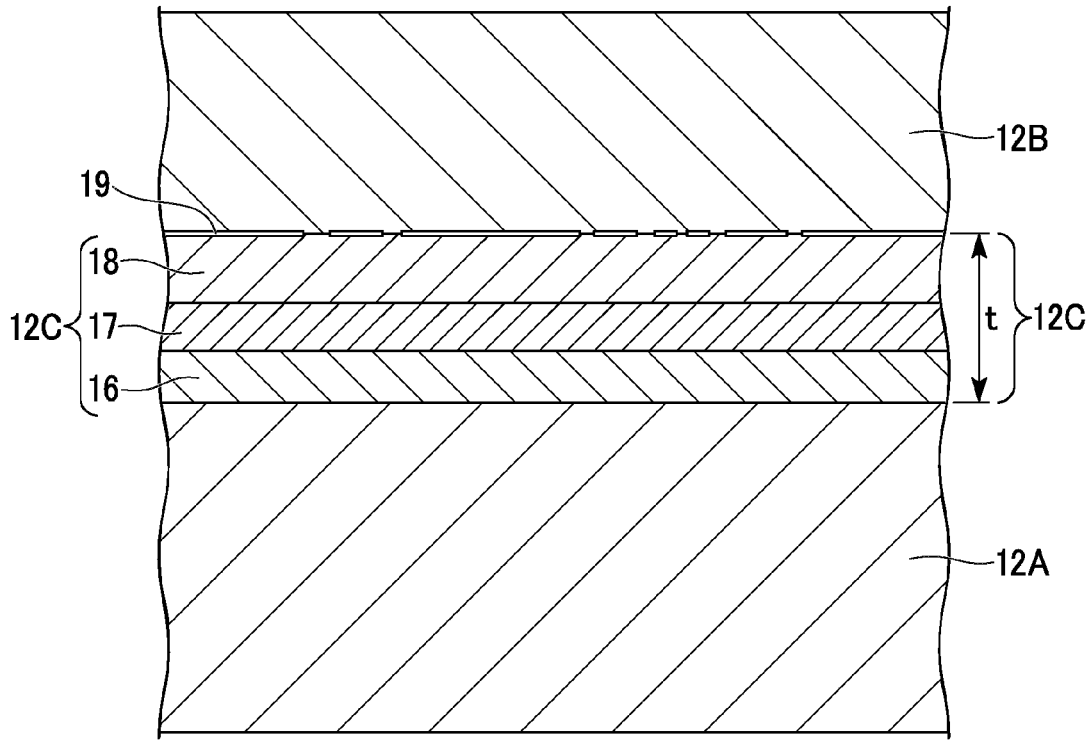
FIG. 3 shows an explanatory enlarged view of a diffusion layer in FIG. 2.

FIG. 3 shows an explanatory enlarged view of the diffusion layer 12C. The diffusion layer 12C is formed of intermetallic compounds including Cu and Al, and in the present embodiment, the diffusion layer 12C has a structure in which a plurality of intermetallic compounds is laminated along the bonding interface. Here, the thickness t of the diffusion layer 12C is set to be in a range of 1 to 80 μm, and preferably in a range of 5 to 80 μm.

In the present embodiment, as shown in FIG. 3, it has a structure in which three intermetallic compounds are laminated. In the thickness direction of the power module substrate 10, θ phase 16, η2 phase 17, and ζ2 phase 18 are arranged in order from the aluminum layer 12A toward the copper layer 12B.

Also, in an interface between the diffusion layer 12C and the copper layer 12B, and oxide 19 is dispersed in the form of a layer along the bonding interface. In addition, the oxide 19 is an aluminum oxide such as alumina ($Al_2O_3$). As shown in FIG. 3, the oxide 19 is dispersed in a state of being divided in the interface between the diffusion layer 12C and the copper layer 12B, and the diffusion layer 12C and the copper layer 12B are directly in contact in some regions. Furthermore, in the present embodiment, the average crystal particle size of the copper layer 12B is in a range of 50 to 200 μm, and the average crystal particle size of the aluminum layer 12A is 500 μm or more.

A heatsink 31 dissipates the heat of the power module substrate 10. The heatsink 31 is desirable to be made of a material having a good thermal conductivity, and in the present embodiment, it is made of A6063 (aluminum alloy). In the heatsink 31, a flow path 32 through which a fluid for cooling flows is provided.

In addition, in the present embodiment, the metal layer 13 of the power module substrate 10 and the heatsink 31 are bonded via a bonding layer 33.

The bonding layer 33 bonds the power module substrate 10 and the heatsink 31 together. In the present embodiment, as shown in FIG. 5, a copper plate 43 made of a rolled sheet of an oxygen-free copper is arranged between the metal layer 13 and the heatsink 31, and the metal layer 13 and the heatsink 31 are bonded together via the bonding layer 33 by solid phase diffusion bonding. In the bonding layer 33, a concentration gradient of aluminum and copper is formed by the mutual diffusion of aluminum and copper. The bonding layer 33 has a concentration gradient in which a concentration of copper atoms gradually decreases and a concentration of aluminum atoms gradually increases from the metal layer 13 toward the heatsink 31.

Next, a power module 1, a power module substrate with a heatsink 30, and a power module substrate 10 according to the present embodiment will be explained with reference to FIG. 4 and FIG. 5.

First, as shown in FIG. 5, the aluminum plates 22A and 23 are laminated on the first surface and the second surface of the ceramic substrate 11 via an Al—Si-based brazing material. Then, the ceramic substrate 11 and the aluminum plates 22A and 23 are bonded together by heating the ceramic substrate 11 and the aluminum plates 22A and 23 while pressurizing thereof, and then cooling thereof, and the aluminum layer 12A and the metal layer 13 are formed (aluminum layer and metal layer bonding step S11). In addition, the brazing temperature is set at 640 to 650° C.

Next, as shown in FIG. 5, the copper plate 22B is arranged on one side of the aluminum layer 12A, the copper plate 43 is arranged to the other side of the metal layer 13, and the heatsink 31 is further arranged to the other side of the copper plate 43. The ceramic substrate 11; the aluminum layer 12A and metal layer 13 formed on both surfaces of the ceramic substrate 11; and the copper plate 22B, the copper plate 43 and the heatsink 31 arranged to the aluminum layer 12A and the metal layer 13 as described above, are pressurized from one side and the other side of this laminated body, and placed in a vacuum heating furnace. In the present embodiment, the pressure applied to the each of the interfaces between the aluminum layer 12A and the copper plate 22B, the metal layer 13 and the copper plate 43, and the heatsink 31 and the copper plate 43 is 3 to 35 kgf/cm$^2$. The heating temperature of the vacuum heating is carried out at 400° C. or more to less than 548° C. with maintaining the temperature for 5 to 240 minutes and solid phase diffusion bonding is performed, and at the same time of forming the copper layer 12B by bonding the aluminum layer 12A and the copper plate 22B, the metal layer 13 and the heatsink 31 are bonded together via the bonding layer 33 (copper layer and heatsink bonding step S12). In the present embodiment, each of the bonding surfaces of the aluminum layer 12A and the copper plate 22B, the metal layer 13 and the copper plate 43, and the heatsink 31 and the copper plate 43 is performed smoothing to remove scratches on these surfaces in advance, and after that, solid phase diffusion bonding is performed.

In addition, at the same time, in a case where the copper plate 22B is bonded by solid phase diffusion bonding to one side of the aluminum layer 12A, the copper plate 43 is bonded by solid phase diffusion bonding to the other side of the metal layer 13, and the heatsink 31 is bonded by solid phase diffusion bonding to the other side of the copper plate 43, the preferable heating temperature of the vacuum heating is in the range of less than an eutectic temperature to the eutectic temperature −5° C., and the eutectic temperature is the lowest eutectic temperature among the eutectic temperature of the metal (Al) configuring the aluminum plate 22A and the metal (Cu) configuring the copper plate 22B, the eutectic temperature of the metal (Al) configuring the aluminum plate 23 and the metal (Cu) configuring the copper 43, and the metal (Al—Mg—Si-based) configuring the heatsink 31 and the metal (Cu) configuring the copper 43.

According to the above, the circuit layer 12 including the aluminum layer 12A and the copper layer 12B on laminated one side of the aluminum layer 12A is formed.

In the above manner, the power module substrate with heatsink 30 in which the circuit layer 12 is formed on one side of the ceramic substrate 11 and the power module substrate 10 of the present embodiment can be obtained.

The semiconductor device 3 is mounted on one side (the surface) of the circuit layer 12 via a solder material, and solder joint is carried out at inside a reduction furnace (semiconductor device bonding step S13).

In this manner, the power module 1 according to the present embodiment is produced.

According to the power module substrate with a heatsink 30 and the power module substrate 10 of the present embodiment having the above structure, the circuit layer 12 includes the copper layer 12B, and the semiconductor device 3 is mounted on the copper layer 12B. Thus, compared to the circuit layer composed of aluminum, the heat generated from the semiconductor device 3 is spread in a surface direction in the copper layer 12B included in the circuit layer 12, the heat can be dissipated efficiently to the power module substrate 10. In the power module substrate with a heat sink 30, the heat of the power module substrate 10 can be further dissipated by the heatsink 31.

Furthermore, the aluminum layer 12A, which is made of aluminum having a relatively small deformation resistance, and metal layer 13 are formed on the first surface and the second surface of the ceramic substrate 11, and since the aluminum layer 12A and the metal layer 13 absorb the heat stress caused by the difference in each thermal expansion coefficient between the ceramic substrate 11 and the circuit layer 12, and the ceramic substrate 11 and the metal layer 13 in a case where a heat cycle is performed, a high reliability with respect to the heat cycle can be obtained.

In addition, since the copper layer 12B having relatively high deformation resistance is formed on one side of the aluminum layer 12A, in a case where a power cycle is performed, deformation of the circuit layer 12 can be suppressed, and a high reliability with respect to the power cycle can be obtained.

In addition, in the present embodiment, since the diffusion layer 12C including Cu and Al is formed in between the aluminum layer 12A and the copper layer 12B, Al in the aluminum layer 12A diffuses sufficiently to the copper layer 12B, Cu in the copper layer 12B diffuses sufficiently to the aluminum layer 12A, the aluminum layer 12A and the copper layer 12B are reliably bonded by solid phase diffusion bonding, and the bonding strength can be secured.

In addition, in the bonding interface between the copper layer 12B and the diffusion layer 12C, since the oxide 19 is dispersed in the form of a layer along the bonding interface, an oxide film formed to the aluminum layer 12A is reliably broken, the mutual diffusion between Cu and Al has progressed sufficiently, and the copper layer 12B and the diffusion layer 12C are securely bonded.

In addition, in the present embodiment, since the diffusion layer 12C has a structure in which a plurality of intermetallic compounds is laminated along the bonding interface, the intermetallic compounds, which are brittle, are prevented from growing large. Also, since intermetallic compounds, which are suitable for each composition, are formed in a form of a layer from the copper layer 12B toward the aluminum layer 12A by the result of that Cu in the copper layer 12B and Al in the aluminum layer 12A are diffused mutually, the properties of the bonding interface can be stable.

Specifically, the diffusion layer 12C is formed by being laminated of three intermetallic compounds of θ phase 16, η2 phase 17, and ζ2 phase 18 being arranged in order from the aluminum layer 12A toward the copper layer 12B. Thus, the volume change inside the diffusion layer 12C becomes small, and an internal distortion of the diffusion layer 12C is suppressed.

Furthermore, in the present embodiment, the average crystal particle size of the aluminum layer 12A is 500 μm or more and the average crystal particle size of the copper layer 12B is in a range of 50 to 200 μm, and thus, the average crystal particle sizes of the aluminum layer 12A and the copper layer 1213 are set relatively large. Hence, an excessive distortion or the like is not accumulated in the aluminum layer 12A and the copper layer 12B, and fatigue characteristics are improved. Therefore, in the performance of the heat cycle, the bonding reliability with respect to thermal stress generated between the power module substrate 10 and the heatsink 31 is improved.

Moreover, in the present invention, the average thickness of the diffusion layer 12C is in a range of 1 to 80 μm, more preferably 5 to 80 μm. Thus, the mutual diffusion between Cu and Al progresses sufficiently, the aluminum layer 12A and the copper layer 12B are bonded together firmly, the intermetallic compounds, which are brittle compared to the aluminum layer 12A and the copper layer 12B, can be suppressed from being grown more than necessary, and the properties of the bonding interface becomes stable.

Here, the preferable thickness of the copper layer 12B is 0.1 to 6.0 mm.

By setting the thickness of the copper layer 12B to 0.1 mm or more, the heat from the semiconductor device 3 is spread in the copper layer 12B and is transferred effectively, and the initial thermal resistance when the power cycle is carried out can be reduced. Thus, the reliability with respect to the power cycle can be further increased. In addition, by setting the thickness of the copper layer 12B to 0.6 mm or less, the rigidity of the circuit layer 12 is reduced and the occurrence of cracking in the ceramic substrate 11 can be suppressed when the heat cycle is carried out.

In the power module substrate 10 and the power module 1 using the power module substrate with a heatsink 30 which are described above, the heat generated from the semiconductor device 3 can be dissipated efficiently. Also, an increase in temperature of the semiconductor device 3 is suppressed, the semiconductor device 3 can be operated at a predetermined temperature, and the stability of the operation thereof can be improved.

In addition, in the present embodiment, since the aluminum layer 12A and the copper layer 12B are bonded together by solid phase diffusion bonding, the circuit layer 12 including the aluminum layer 12A, which is formed on one side of the ceramic substrate 11, and the copper layer 12B can be obtained.

In addition, solid phase diffusion bonding is configured by forming the aluminum layer 12A on the first surface of the ceramic substrate 11 and forming the metal layer 13 on the second surface of the ceramic substrate 11, and maintaining the temperature of 400° C. or more to less than 548° C. in a state of pressurizing at a pressure of 3 to 35 kgf/cm² with respect to each of: the aluminum layer 12A and the copper plate 22B; the metal layer 13 and the copper plate 43; and the heatsink 31 and the copper plate 43, after arranging the copper plate 22B to one side of the aluminum layer 12A and arranging the copper plate 43 and the heatsink 31 to the other side of the metal layer 13. By such a configuration, solid phase diffusion bonding is carried out by performing solid phase diffusion of copper atoms of the copper plate 22B into the aluminum layer 12A and by performing solid phase diffusion of aluminum atoms of the aluminum layer 12A into the copper plate 22B in a state in which the aluminum layer 12A is sufficiently in close contact with the copper plate 22B, and the copper layer 12B can be reliably formed to one side of the aluminum layer 12A.

Furthermore, by performing solid phase diffusion bonding in this way, an occurrence of gap between the aluminum layer 12A and the copper layer 1213 can be suppressed and the aluminum layer 12A and the copper layer 12B can be bonded together. Thus, a good thermal conductivity and a good electrical conductivity in the bonding interface between the aluminum layer 12A and the copper layer 12B are achieved, and the heat generated from the semiconductor device 3 can be dissipated efficiently to the ceramic substrate 11. Moreover, the diffusion layer 12C is formed in the interface between the aluminum layer 12A and the copper layer 12B which are bonded together by solid phase diffusion bonding. Since the diffusion layer 12C is formed by solid diffusion, the bonding strength is high. Thus, when the heat cycle and the power cycle are performed, peeling of the interfaces does not occur easily and a good bonding state can be maintained, and the thermal conductivity and the electrical conductivity can be maintained.

In addition, solid phase diffusion bonding is performed to each of the sets of the metal layer 13 and the copper plate 43, and the heatsink 31 and the copper plate 43, and the metal layer 13 and the heatsink 31 can be bonded together via the bonding layer 33. Furthermore, since the metal layer 13 and the heatsink 31 are bonded together via the bonding layer 33 along with suppressing an occurrence of a gap between the metal layer 13 and the heatsink 31 by performing solid phase diffusion bonding in the conditions described above, a good thermal conductivity in between the metal layer 13 and the heatsink 31 can be achieved. Furthermore, the metal layer 13 and the heatsink 31 are firmly bonded together by the bonding layer 33, and thus, when the heat cycle and the power cycle are performed, peeling of each of the interfaces between the metal layer 13 and the bonding layer 33, and the heatsink 31 and the bonding layer 33 does not occur easily, a good bonding conditions can be maintained, and the thermal conductivity can be maintained.

In a case where a pressure applied to the aluminum layer 12A and the copper plate 22B is less than 3 kgf/cm² when solid phase diffusion bonding is performed, it is difficult to bond the aluminum layer 12A and the copper plate 22B together sufficiently, and it may cause a gap between the aluminum layer 12A and the copper layer 12B. In addition, in a case where a pressure applied thereto exceeds 35 kgf/cm², since the applied pressured is too high, cracks may occur to the ceramic substrate 11, and thus, the applied pressure when solid phase diffusion bonding is performed is set to the above range.

In a case where the temperature during performing solid phase diffusion bonding is 400° C. or more, diffusion of aluminum atoms and copper atoms are promoted, and sufficient solid phase diffusion can be performed in a short amount of time. In addition, in a case where the temperature is less than 548° C., a generation of humps in bonding interfaces caused of a generation of a liquid phase between aluminum and copper, and thickness variation can be suppressed. Thus, the preferable temperature of solid phase diffusion bonding is set in a range of 400° C. or more to less than 548° C.

In addition, a more desirable heat treatment temperature during performing solid phase diffusion bonding is in a range of less than an eutectic temperature (not including the eutectic temperature) of the metal (Al) configuring the aluminum plate 22A and the metal (Cu) configuring the copper plate 22B to the eutectic temperature −5° C. When such range of less than the eutectic temperature (not including the eutectic temperature) to the eutectic temperature −5° C. is selected, since a liquid phase is not formed and compounds of aluminum and copper are not generated, a good bonding reliability of solid phase diffusion bonding is achieved, and furthermore, since a diffusion rate during performing solid phase diffusion bonding is fast and solid phase diffusion bonding can be performed in a relatively short time, the more desirable heat treatment temperature is set as described above.

In addition, in a case where there are scratches on the surface on which bonding will be performed when solid phase diffusion bonding is performed, a gap may occur when solid phase diffusion bonding is performed. However, since each of the surfaces on which bonding between the aluminum layer 12A and the copper plate 22B, the metal layer 13 and the copper plate 43, and the heatsink 31 and the copper plate 43 will be performed are removed scratches and are smoothed in advance, and after the above, since solid phase diffusion bonding is performed, the generation of gaps in each of the bonding interfaces is suppressed and bonding can be performed.

Since the semiconductor device 3 is bonded to the copper layer 12B via a solder layer 2, soldering can be performed well comparing to a case of bonding to the circuit layer made of aluminum.

In the present embodiment, since the metal layer 13 and the heatsink 31 are bonded together by solid phase diffusion bonding via the bonding layer 33, and a solder or a grease, which has less thermal conductivity than that of aluminum and copper, is not interposed between the metal layer 13 and the heat sink 31, the thermal conductivity in between the metal layer 13 and the heatsink 31 can be improved.

In addition, since the copper layer 12B and the heatsink 31 can be bonded together at once, the producing cost can be reduced significantly.

Since the power module 1 according to the present embodiment includes the heatsink 31 under the power module substrate 10, the heat generated from the semiconductor device 3 is transmitted to the power module substrate 10, and the heat can be dissipated efficiently via the heatsink 31.

The embodiment of the present invention has been explained as above. However, the present invention is not limited thereto and can be appropriately changed without departing from the technical concept of the present invention.

In addition, the above embodiment has been explained the case where the copper layer and the heatsink are bonded together at once by solid phase diffusion bonding. However, after forming the copper layer by solid phase diffusion bonding, the heatsink can be bonded to the copper layer by solid phase diffusion bonding.

The embodiment has been explained with respect to the case of forming the copper layer by bonding the copper plate to one side of the aluminum layer by solid phase diffusion bonding after forming the aluminum layer on the first surface of the ceramic substrate. However, after bonding the aluminum plate and the copper plate together by solid phase diffusion bonding, the aluminum plate and the copper plate which was bonded together can be bonded to the first surface of the ceramic substrate.

The above embodiment has been explained that the aluminum layer and the metal layer formed on the first surface and the second surface of the ceramic substrate are a rolled sheet of pure aluminum having purity of 99.99%. However, it is not limited thereto, and aluminum having a purity of 99% (2N aluminum), aluminum alloy or the like can be used.

In addition, the above embodiment has been explained the case in which the copper layer is made of an oxygen-free copper. However, it is not limited thereto, and the copper layer can be formed by other copper plates made of a pure copper, a copper alloy or the like.

Furthermore, the embodiment has been explained that the ceramic substrate made of AlN is used as an insulation layer. However, it is not limited thereto, and a ceramic substrate made of $Si_3N_4$, $Al_2O_3$ or the like can be used and an insulating resin can be used as an insulation layer.

The above embodiment has been explained that the power module substrate includes the metal layer. However, it may not include the metal layer.

In addition, the above embodiment has been explained that the power module includes the heatsink. However, it may not include the heatsink.

The above embodiment has been explained the case in which the metal layer of the power module substrate and the heatsink are bonded together by solid phase diffusion bonding with interposing the copper plate between them. However, the metal layer and the heatsink can be joint by a solder, a screwing or the like.

EXAMPLES

Example 1

Hereafter, the result of the confirmation experiment (Example 1) which was performed to confirm the effects of the present invention is explained.

Figure 4:
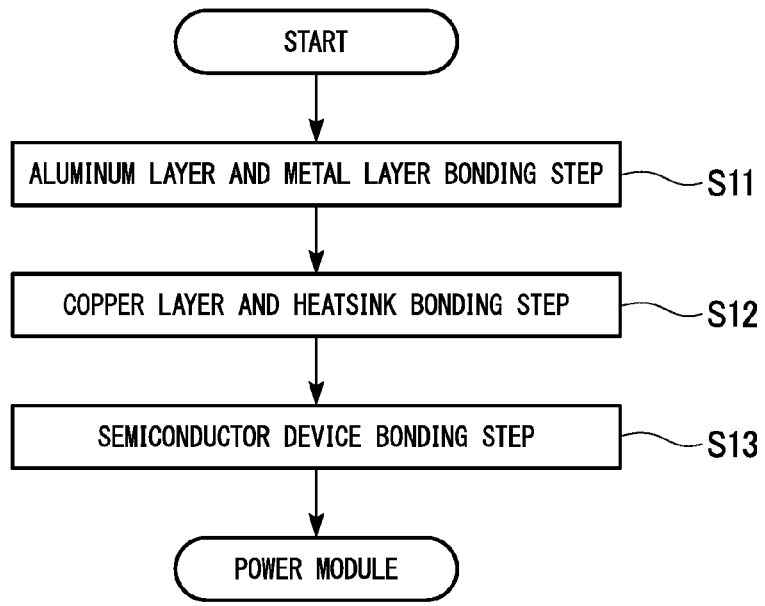
FIG. 4 shows a flow chart of explaining a method for producing a power module according to the embodiment of the present invention.

Solid phase diffusion bonding was performed in the conditions in Table 1 according to the order described in the flow chart in FIG. 4, and the power modules with a heatsink of Examples 1-1 to 1-10 were produced.

In addition, the ceramic substrate was made of AlN, and the substrate having 40×40 mm of size and having 0.635 mm of thickness was used.

The aluminum layer of the circuit layer was made of a rolled sheet of 4N aluminum, and the aluminum layer having 37×37 mm of size and having 0.1 mm of thickness was used.

The copper layer of the circuit layer was made of a rolled sheet of an oxygen-free copper, and the copper layer having 37×37 mm of size and having 0.3 mm of thickness was used.

The metal layer was made of a rolled sheet of 4N aluminum, and the copper layer having 37×37 mm of size and having 1.6 mm of thickness was used.

The bonding layer was formed of a rolled sheet of an oxygen-free copper, and the bonding layer having 37×37 mm of size and having 0.05 mm of thickness was used. The heatsink was made of a rolled sheet of A6063 alloy, and the heatsink having 50×50 mm of size and having 5 mm of thickness was used.

Solid phase diffusion bonding was performed in a condition in which a pressure inside the vacuum heating furnace is in a range of $10^{-6}$ Pa to $10^{-3}$ Pa.

The semiconductor device was IGBT device, and the semiconductor device having 12.5×9.5 mm of size and having 0.25 mm of thickness was used.

<Heat Cycle Test>

Heat cycle test was performed by using a thermal shock testing apparatus TSB-51 manufactured by ESPEC Corporation, the cycles were repeated at −40° C. for 5 minutes and at 125° C. for 5 minutes in liquid phase (Fluorinert) with respect to the samples (power module with a heatsink), and 3000 cycles of the heat cycle were performed.

<Power Cycle Test>

Power cycle test was performed by using a power module with a heatsink produced by bonding bonding wires made of an aluminum alloy along with soldering the IGBT device to the copper layer by using an Sn—Ag—Cu solder. Under a state in which a temperature and a flow rate of a cooling water inside the heatsink are constant, energizing and de-energizing of the IGBT device were adjusted so that one cycle in which a device surface temperature becomes 140° C. in energized state (ON) and the device surface temperature becomes 80° C. in de-energized state (OFF) is repeated every 10 seconds, and the power cycle repeating 100,000 times of this cycle was performed.

A junction rate of the interface between the aluminum layer and the copper layer, and a thermal resistance of the power module with a heatsink were measured in before and after the heat cycle test and before and after the power cycle test.

<Evaluation of the Junction Rate of the Interface Between the Aluminum Layer and the Copper Layer>

With respect to the power module with a heatsink before and after the power cycle test, the junction rate of the interface between the aluminum layer and the copper layer was evaluated using an ultrasonic flaw detection device, and the junction rate was calculated from the calculation formula shown below. Here, the initial bonding area is a target area of bonding at the time before the bonding, that is, the areas of the aluminum layer and the copper layer in the present examples. Since the peeled off part is indicated by a white part in the bonding part in an ultrasonic flaw detection image, the area of the white part is set as a peeled off area.

(Junction rate)={(Initial bonding area)−(Peeled off area)}/(Initial bonding area)

<Evaluation of the Thermal Resistance>

The thermal resistance was measured as follows. A heater chip (semiconductor device) was heated by 100 W of power, and the temperature of the heater chip was measured using a thermocouple. In addition, the temperature of a cooling medium (ethylene glycol:water=9:1) flowing through the heatsink was measured. A value in which the temperature difference between the heat chip and the cooling medium is divided by power was defined as the thermal resistance.

The evaluation results of the above are shown in Table 1.

heatsink have a high bonding reliability with respect to the power cycle and the heat cycle.

In addition, in the Examples 1-1 to 1-6, both junction rates after the heat cycle test and after the power cycle test were even higher, and thus, it was confirmed that they are the power modules with a heatsink having a further high bonding reliability with respect to the power cycle and the heat cycle.

Example 2

Hereafter, the result of the confirmation experiment (Example 2) which was performed to confirm the effects of the present invention is explained.

Solid phase diffusion bonding was performed in the conditions of: 9 kgf/cm$^2$ of pressure; 540° C. of temperature; and 180 minutes of holding time, according to the order described in the flow chart in FIG. 4, and the power modules with a heatsink of Examples 2-1 to 2-8 were produced.

In addition, the ceramic substrate was made of AlN, and the substrate having 40×40 mm of size and having 0.635 mm of thickness was used.

The aluminum layer of the circuit layer was made of a rolled sheet of 4N aluminum, and size thereof being 37×37 mm, and thickness thereof being 0.6 mm in the Examples 2-1 to 2-7 and being 0.1 mm in the Example 2-8 were used.

The copper layer of the circuit layer was made of a rolled sheet (copper plate) of an oxygen-free copper, the copper layer having 37×37 mm of size was used, and thickness thereof was set to the thickness as shown in Table 2.

The metal layer was made of a rolled sheet of 4N aluminum, and the copper layer having 37×37 mm of size and having 1.6 mm of thickness was used.

The bonding layer was formed of a rolled sheet of an oxygen-free copper, and the bonding layer having 37×37 mm of size and having 0.05 mm of thickness was used. The heatsink was made of a rolled sheet of A6063 alloy, and the heatsink having 50×50 mm of size and having 5 mm of thickness was used.

Solid phase diffusion bonding was performed in a condition in which a pressure inside the vacuum heating furnace is in a range of 10$^{-6}$ Pa to 10$^{-3}$ Pa.

TABLE 1

| | Conditions of Solid Diffusion Bonding | | | Power Cycle Test | | | | Heat Cycle Test | | | |
| | | | | Before | | After | | Before | | After | |
| | Loading Pressure kgf/cm2 | Temperature ° C. | Time minute | Thermal Resistance ° C./W | Junction Rate % | Thermal Resistance ° C./W | Junction Rate % | Thermal Resistance ° C./W | Junction Rate % | Thermal Resistance ° C./W | Junction Rate % |
|---|---|---|---|---|---|---|---|---|---|---|---|
| Example 1-1 | 3 | 480 | 120 | 0.320 | 100 | 0.321 | 99.3 | 0.320 | 100 | 0.326 | 97 |
| Example 1-2 | 35 | 480 | 120 | 0.320 | 100 | 0.322 | 99.2 | 0.320 | 100 | 0.324 | 98.1 |
| Example 1-3 | 9 | 400 | 180 | 0.323 | 98.6 | 0.323 | 98.4 | 0.322 | 98.9 | 0.325 | 97.3 |
| Example 1-4 | 9 | 540 | 180 | 0.327 | 96.3 | 0.328 | 96.1 | 0.320 | 100 | 0.332 | 93.8 |
| Example 1-5 | 24 | 540 | 15 | 0.320 | 99.8 | 0.321 | 99.5 | 0.323 | 98.5 | 0.336 | 92.2 |
| Example 1-6 | 10 | 540 | 30 | 0.325 | 97.4 | 0.326 | 97.1 | 0.321 | 99.5 | 0.330 | 95.1 |
| Example 1-7 | 2 | 520 | 60 | 0.320 | 100 | 0.323 | 98.5 | 0.322 | 98.8 | 0.350 | 85 |
| Example 1-8 | 40 | 520 | 60 | 0.320 | 100 | 0.325 | 97.3 | 0.320 | 100 | 0.352 | 83.9 |
| Example 1-9 | 21 | 380 | 240 | 0.323 | 98.6 | 0.327 | 96.3 | 0.323 | 98.6 | 0.345 | 87.5 |
| Example 1-10 | 12 | 380 | 5 | 0.320 | 100 | 0.328 | 96.2 | 0.320 | 100 | 0.355 | 82.5 |

In the Examples 1-1 to 1-10, both junction rates after the heat cycle test and after the power cycle test were high, and thus, it was confirmed that the power modules with a The semiconductor device was IGBT device, and the semiconductor device having 12.5×9.5 mm of size and having 0.25 mm of thickness was used.

In addition, the following power module with a heatsink was produced as a Conventional Example 1.

First, a copper plate (37×37 mm of size, and 0.3 mm of thickness) made of an oxygen-free copper served as a circuit layer, a ceramic substrate composed of AlN, and a copper plate (37×37 mm of size, and 0.3 mm of thickness) made of an oxygen-free copper served as a metal layer were laminated via a brazing filler metal composed of Ag-27.4% by mass of Cu-2.0% by mass of Ti, the laminated body was installed inside a vacuum heating furnace in $10^{-3}$ Pa of a vacuum atmosphere in a state of pressurizing at 0.5 kgf/cm$^2$ in a laminating direction, was heated at 850° C. for 10 minutes, was bonded together, and thereby, a power module substrate was produced. Next, the power module substrate and IGBT device (12.5 mm×9.5 mm of size, and 0.25 mm of thickness) were bonded together, a heatsink was bonded thereto, and a power module with a heatsink was produced.

Furthermore, a power module with a heatsink produced by the following means as a Conventional Example 2.

First, an aluminum plate (37×37 mm of size, and 0.4 mm of thickness) served as a circuit layer, a ceramic substrate composed of AlN, and an aluminum plate (37×37 mm of size, and 0.4 mm of thickness) served as a metal layer were laminated via a brazing filler metal composed of Al-10% by mass of Si, the laminated body was installed inside a vacuum heating furnace in a state of pressurizing at 5 kgf/cm$^2$ in a laminating direction, was heated at 650° C. for 30 minutes, was bonded together, and thereby, a power module substrate was produced. Next, the power module substrate and IGBT device (12.5 mm×9.5 mm of size, and 0.25 mm of thickness) were bonded together, heatsink was bonded thereto, and a power module with a heatsink was produced.

<Heat Cycle Test>

Heat cycle test was performed to the power module substrate with a heatsink in the same way as the Example 1.

A junction rate of the interface between the ceramic substrate and the circuit layer was measured after the heat cycle test.

<Evaluation of the Junction Rate of the Interface Between the Ceramic Substrate and the Circuit Layer>

With respect to the power module with a heatsink after the heat cycle test, the junction rate of the interface between the ceramic substrate and the circuit layer was evaluated using the ultrasonic flaw detection device, and the junction rate was calculated from the calculation formula shown below. Here, the initial bonding area is a target area of bonding at the time before the bonding, that is, the area of the circuit layer in the present examples. Since the peeled off part is indicated by a white part in the bonding part in an ultrasonic flaw detection image, the area of the white part is set as a peeled off area. In addition, in a case where cracks occur in the ceramic substrate in the heat cycle test, the cracks is shown by the white part in an ultrasonic flaw detection image, and the junction rate becomes small. Therefore, the junction rate was evaluated by a total of the peeled off area in the interface thereof and the area of the cracks of the ceramic substrate.

(Junction rate)={(Initial bonding area)−(Peeled off area)}/(Initial bonding area)

<Power Cycle Test>

Power cycle test was performed to the power module substrate with a heatsink the same way as the Example 1.

An initial thermal resistance in the power cycle test and the thermal resistance after power cycle test were measured.

The measurement of the thermal resistance was performed in the same way as the Example 1.

The evaluation results of the above are shown in Table 2.

TABLE 2

| | | Power Cycle Test | | Heat Cycle |
|---|---|---|---|---|
| | Thickness of Copper Plate mm | Initial Thermal Resistance ° C./W | Thermal Resistance after Test ° C./W | Test Junction Rate after Test % |
| Example 2-1 | 0.1 | 0.333 | 0.335 | 98.9 |
| Example 2-2 | 0.6 | 0.315 | 0.317 | 96.2 |
| Example 2-3 | 1.0 | 0.294 | 0.296 | 98.8 |
| Example 2-4 | 2.0 | 0.268 | 0.269 | 99.5 |
| Example 2-5 | 3.0 | 0.245 | 0.247 | 96.0 |
| Example 2-6 | 4.0 | 0.221 | 0.224 | 96.7 |
| Example 2-7 | 5.0 | 0.204 | 0.210 | 99.3 |
| Example 2-8 | 0.3 | 0.335 | 0.336 | 97.0 |
| Conventional Example 1 | Thickness of Circuit Layer 0.3 mm | 0.343 | 0.344 | 68.3 |
| Conventional Example 2 | Thickness of Circuit Layer 0.4 mm | 0.355 | 0.399 | 96.4 |

In the Conventional Example 1, a rise of the initial thermal resistance of the power cycle test and the thermal resistance after the power cycle test was small. However, cracks were occurred in the ceramic substrate in the heat cycle test, and the junction rate in the interface between the ceramic substrate and the circuit layer was reduced.

In addition, in the Conventional Example 2, the junction rate between the ceramic substrate and the circuit layer after the heat cycle test was high. However, the initial thermal resistance of the power cycle test was large and a rise of the thermal resistance after the power cycle test was also large.

On the other hand, in the Examples 2-1 to 2-8, the initial thermal resistance was small in the power cycle test, a rise of the thermal resistance after the power cycle test was small, and the test result was good. Furthermore, the junction rate in the interface between the ceramic substrate and the aluminum layer (circuit layer) was large, and the test result was good. According to the above, it was confirmed that the Examples 2-1 to 2-8 are the power modules with a heatsink having a high bonding reliability with respect to the load of the power cycle and the heat cycle.

FIELD OF INDUSTRIAL APPLICATION

The present invention can provide a power module substrate suppressing an increase in the thermal resistance when the power cycle is performed thereon, suppressing occurrence of cracks in the ceramic substrate when the heat cycle is performed, and having a high reliability with respect to the power cycle and the heat cycle, a power module substrate with heatsink, a power module, and a method for producing a power module substrate.

DESCRIPTION OF REFERENCE SIGNS

1: Power module
3: Semiconductor chip
10: Power module substrate
11: Ceramic substrate (Insulation layer)
12: Circuit layer
12A: Aluminum layer
12B: Copper layer
12C: Diffusion layer 13: Metal layer
30: Power module substrate with heatsink
31: Heatsink

The invention claimed is:

1. A power module substrate comprising:
a ceramic substrate,
and a circuit layer formed on a surface of the ceramic substrate,
wherein the circuit layer includes an aluminum layer arranged on the surface of the ceramic substrate and,
a copper layer laminated on one side of the aluminum layer by solid phase diffusion bonding,
wherein a diffusion layer including Cu and Al is formed in a bonding interface between the aluminum layer and the copper layer,
wherein the diffusion layer has a structure in which a plurality of intermetallic compounds is laminated along the bonding interface,
wherein each of the plurality of intermetallic compounds is formed in a form of a layer,
wherein the plurality of intermetallic compounds includes a θ phase, and an η2 phase, and
wherein a layer of each phase is arranged in order of the θ phase and the η2 phase from the aluminum layer toward the copper layer.

2. The power module substrate according to claim 1, wherein
a bonding interface between the copper layer and the diffusion layer has a configuration in which an oxide is dispersed in the form of a layer along the bonding interface.

3. The power module substrate according to claim 1, wherein
a thickness of the copper layer is 0.1 to 6.0 mm.

4. The power module substrate according to claim 1, wherein
the aluminum layer is formed by bonding an aluminum plate having a purity of 99.99% by mass or more to the ceramic substrate.

5. The power module substrate according to claim 1, wherein
a thickness of the diffusion layer is 1 to 80 μm.

6. The power module substrate according to claim 1, wherein
the diffusion layer has a concentration gradient in which the concentration of aluminum atoms lowers gradually and the concentration of copper atoms increases gradually toward the copper layer from the aluminum layer.

7. The power module substrate according to claim 1, wherein
the plurality of intermetallic compounds further includes a ζ2 phase, and
a layer of the ζ2 phase is formed between the η2 phase and the copper layer.

8. A power module substrate with a heatsink comprising:
the power module substrate according to claim 1; and
the heatsink bonded to the other side of the power module substrate.

9. The power module substrate with a heatsink according to claim 8, wherein
the bonding layer has a concentration gradient in which a concentration of copper atoms gradually decreases and a concentration of aluminum atoms gradually increases from the aluminum layer toward the heatsink.

10. A power module comprising:
the power module substrate according to claim 1; and
a semiconductor device bonded to the one side of the circuit layer.

11. A method for producing a power module substrate comprising a ceramic substrate and a circuit layer formed on a surface of the ceramic substrate, the method comprises:
a circuit layer forming step in which the circuit layer is formed on a surface of the ceramic substrate;
wherein the circuit layer forming step comprises:
an aluminum layer arranging step in which an aluminum layer is arranged on the surface of the ceramic substrate; and
a copper laminating step in which a copper layer is laminated on one side of the aluminum layer after the aluminum layer arranging step,
wherein in the copper laminating step, the aluminum layer and the copper layer are bonded together by solid phase diffusion bonding, and a diffusion layer including Cu and Al is formed in a bonding interface between the aluminum layer and the copper layer,
wherein the diffusion layer has a structure in which a plurality of intermetallic compounds is laminated along the bonding interface,
wherein each of the plurality of intermetallic compounds is formed in a form of a layer,
wherein the plurality of intermetallic compounds includes a θ phase, and an η2 phase, and
wherein a layer of each phase is arranged in order of the θ phase and the η2 phase from the aluminum layer toward the copper layer.

12. The method for producing a power module substrate according to claim 11, wherein
in the copper laminating step,
the copper layer is laminated on one side of the aluminum layer, and
the aluminum layer and the copper layer are bonded together by solid phase diffusion bonding by maintaining at 400° C. or more to less than 548° C. in a state of pressurizing the aluminum layer and the copper layer at a pressure of 3 to 35 kgf/cm².

* * * * *